US012707687B2

(12) United States Patent
Murai et al.

(10) Patent No.: US 12,707,687 B2
(45) **Date of Patent: *Aug. 11, 2026**

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Shunta Murai, Kanazawa (JP); Daiki Yoshikawa, Kanazawa (JP); Kazutoshi Nakamura, Nonoichi (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 403 days.

This patent is subject to a terminal disclaimer.

(21) Appl. No.: 18/486,528

(22) Filed: Oct. 13, 2023

(65) Prior Publication Data

US 2024/0321963 A1 Sep. 26, 2024

(30) Foreign Application Priority Data

Mar. 23, 2023 (JP) ................................ 2023-047144

(51) Int. Cl.
*H10D 62/10* (2025.01)
*H10D 12/00* (2025.01)
(Continued)

(52) U.S. Cl.
CPC ......... *H10D 62/127* (2025.01); *H10D 12/481* (2025.01); *H10D 62/133* (2025.01); *H10D 64/112* (2025.01); *H10D 64/117* (2025.01)

(58) Field of Classification Search
CPC ... H10D 62/111; H10D 62/157; H10D 62/393
See application file for complete search history.

(56) References Cited

U.S. PATENT DOCUMENTS

| | | | |
|---|---|---|---|
| 9,589,952 B2 | 3/2017 | Senoo | |
| 2022/0109061 A1 | 4/2022 | Soneida et al. | |
| 2024/0321869 A1 * | 9/2024 | Nakamura | H10D 8/422 |

FOREIGN PATENT DOCUMENTS

| | | |
|---|---|---|
| JP | 2016-225345 | 12/2016 |
| JP | 2022-015194 | 1/2022 |
| JP | 2022-059429 | 4/2022 |

* cited by examiner

*Primary Examiner* — Fazli Erdem
(74) *Attorney, Agent, or Firm* — Knobbe, Martens, Olson & Bear, LLP

(57) ABSTRACT

According to one embodiment, a semiconductor device includes first and second electrodes, and first and second regions. The first region includes a first semiconductor region of a first conductivity type, a second semiconductor region of a second conductivity type, a plurality of third semiconductor regions of the first conductivity type, a gate electrode, a conductive part, a fourth semiconductor region of the second conductivity type, a fifth semiconductor region of the first conductivity type, and a sixth semiconductor region of the second conductivity type. The gate electrode faces one of the plurality of third semiconductor regions via a gate insulating layer. The conductive part faces another one of the plurality of third semiconductor regions via an insulating layer, and is electrically connected with the second electrode. The fourth and six semiconductor regions are located on the one and the other one of the plurality of third semiconductor regions, respectively.

20 Claims, 11 Drawing Sheets

(51) Int. Cl.
*H10D 62/13* (2025.01)
*H10D 64/00* (2025.01)

150

9
21
32d
5b
32b
6
5
21
32c
20
4
5a
32a $p^+$ $p^+$
$n^+$ $n^+$ $n^+$ $n^+$ $n^+$ $n^+$ $n^+$
$p^+$ $p^+$ $p^+$
$n^+$ $p^+$ $n^+$ $p^+$ $n^+$ $p^+$

R2
P2
R1
P1

SEMICONDUCTOR DEVICE

CROSS-REFERENCE TO RELATED APPLICATIONS

This application is based upon and claims the benefit of priority from Japanese Patent Application No. 2023-047144, filed on Mar. 23, 2023; the entire contents of which are incorporated herein by reference.

FIELD

Embodiments of the invention generally relate to a semiconductor device.

BACKGROUND

Semiconductor devices used in power conversion and the like include reverse conducting insulated gate bipolar transistors (RC-IGBTs) in which a diode is embedded in an insulated gate bipolar transistor (IGBT). Technology is desirable in which the switching loss of such a semiconductor device can be reduced.

DETAILED DESCRIPTION

Figure 1:
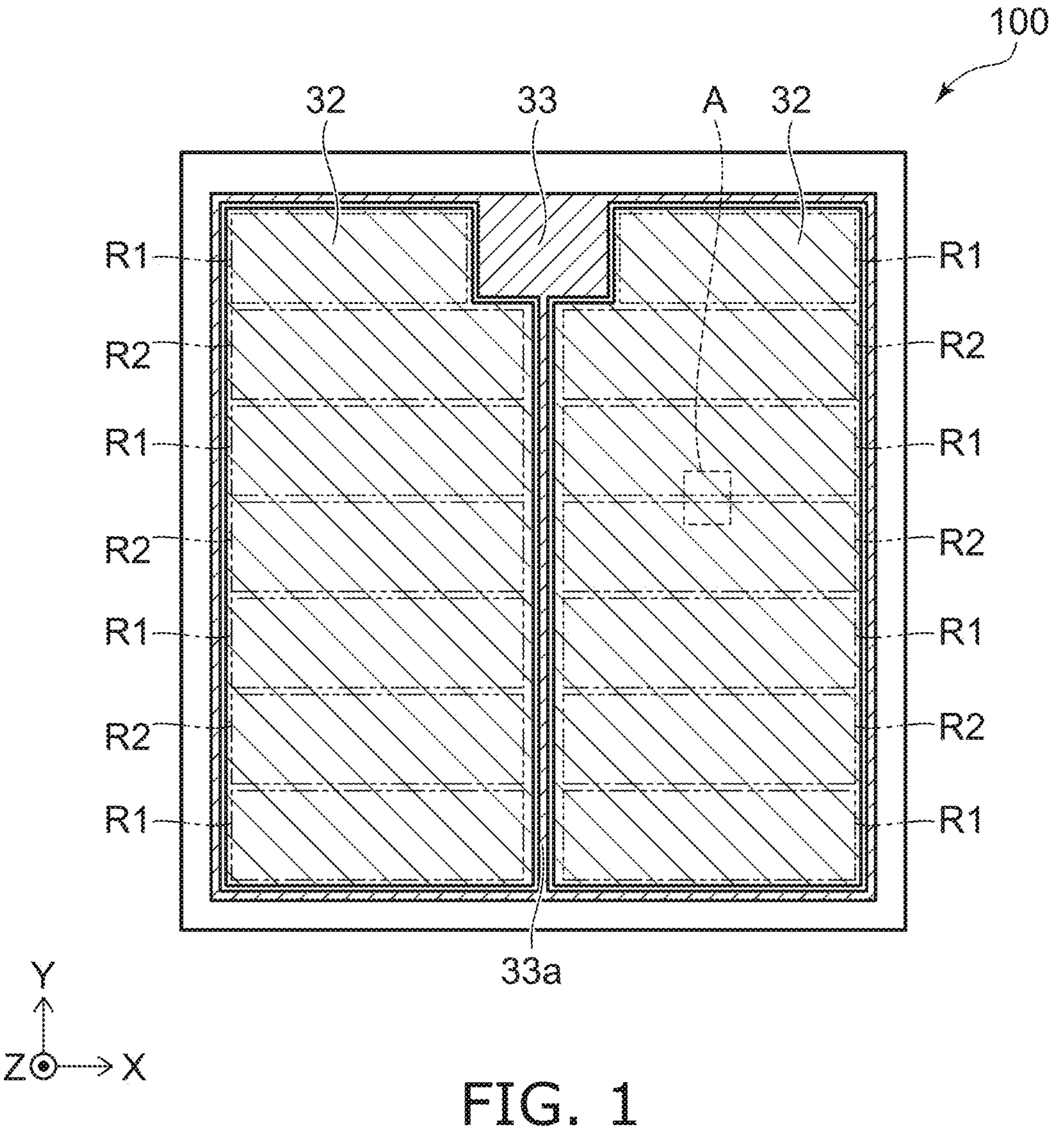
FIG. 1 is a plan view of a semiconductor device according to an embodiment.

According to one embodiment, a semiconductor device includes a first electrode, a second electrode, a first region, and a second region. The second electrode is separated from the first electrode. The first region is located on a portion of the first electrode and positioned between the first electrode and the second electrode. The first region includes a first semiconductor region of a first conductivity type, a second semiconductor region of a second conductivity type, a plurality of third semiconductor regions of the first conductivity type, a gate electrode, a conductive part, a fourth semiconductor region of the second conductivity type, a fifth semiconductor region of the first conductivity type, and a sixth semiconductor region of the second conductivity type. A portion of the second semiconductor region is located on the first semiconductor region. The plurality of third semiconductor regions are located on the portion of the second semiconductor region. The gate electrode faces one of the plurality of third semiconductor regions via a gate insulating layer in a second direction perpendicular to a first direction that is from the first electrode toward the second electrode. The conductive part faces an other one of the plurality of third semiconductor regions via an insulating layer in the second direction, and is electrically connected with the second electrode. The fourth semiconductor region is located on the one of the plurality of third semiconductor regions. The fifth semiconductor region is located on the one of the plurality of third semiconductor regions, and has a higher first-conductivity-type impurity concentration than the one of the plurality of third semiconductor regions. The sixth semiconductor region is located on the other one of the plurality of third semiconductor regions. A length of the sixth semiconductor region in a third direction perpendicular to the first and second directions is greater than a length of the fourth semiconductor region in the third direction. The second region is located on an other portion of the first electrode and positioned between the first electrode and the second electrode. The second region includes a seventh semiconductor region of the second conductivity type, an other portion of the second semiconductor region, and an eighth semiconductor region of the first conductivity type. The seventh semiconductor region has a higher second-conductivity-type impurity concentration than the second semiconductor region. The other portion of the second semiconductor region is located on the seventh semiconductor region. The eighth semiconductor region is located on the other portion of the second semiconductor region.

Various embodiments will be described hereinafter with reference to the accompanying drawings. The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions. In the specification and drawings, components similar to those described or illustrated in a drawing therein above are marked with like reference numerals, and a detailed description is omitted as appropriate.

In the following description, the notations "$n^+$", "n" and "$n^-$" and the notations "$p^+$" and "p". Specifically, the notation "$n^+$" indicates that the n-type impurity concentration is relatively higher than the notation "n", and the notation "$n^-$" indicates that the n-type impurity concentration is relatively lower than the notation "n". The notation "$p^+$" indicates that the p-type impurity concentration is relatively higher than the notation "p".

The embodiments described below may be carried out with the p-type and the n-type of the semiconductor regions inverted.

Figure 2:
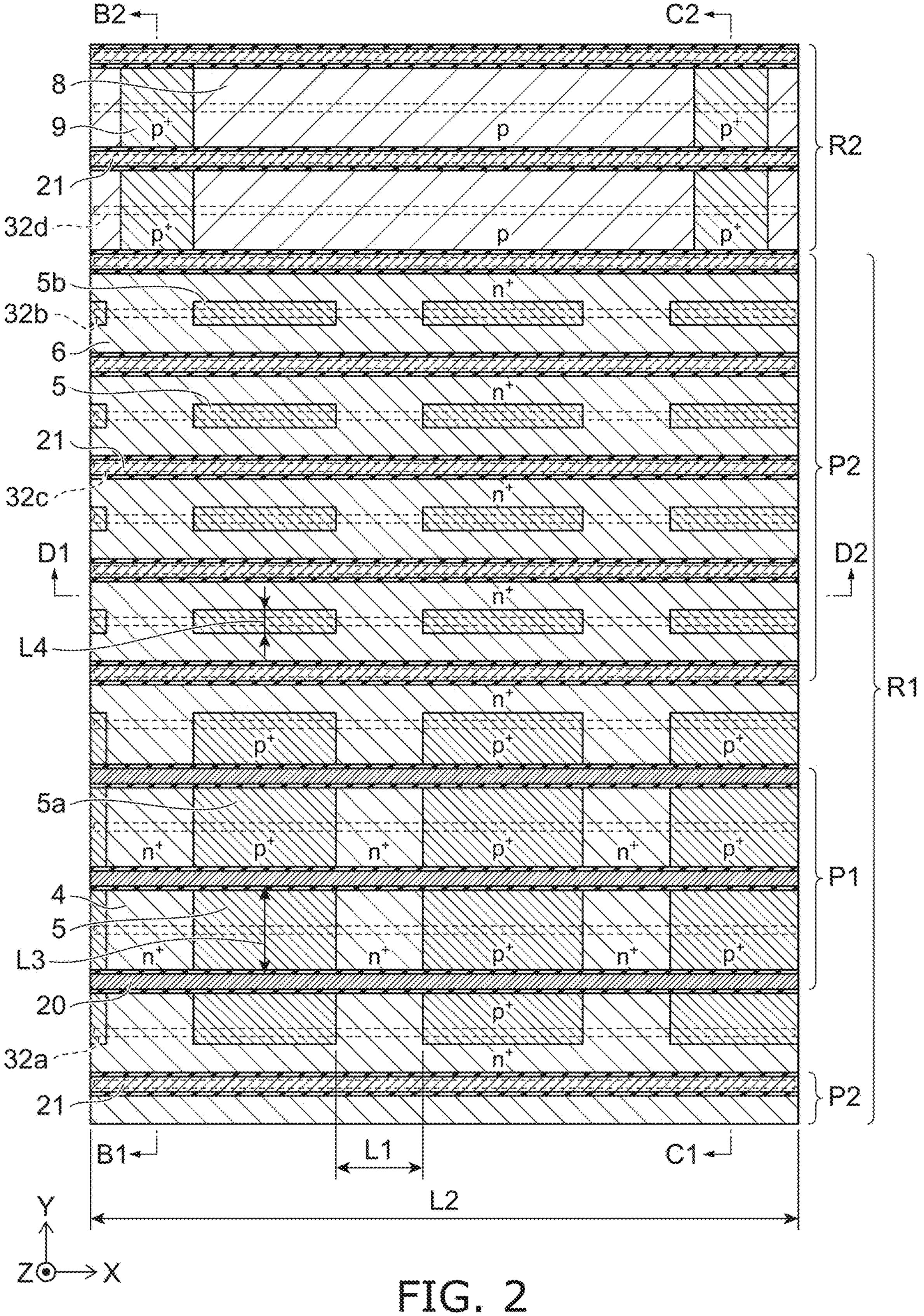
FIG. 2 is an enlarged plan view of portion A of FIG. 1.
Figure 3:
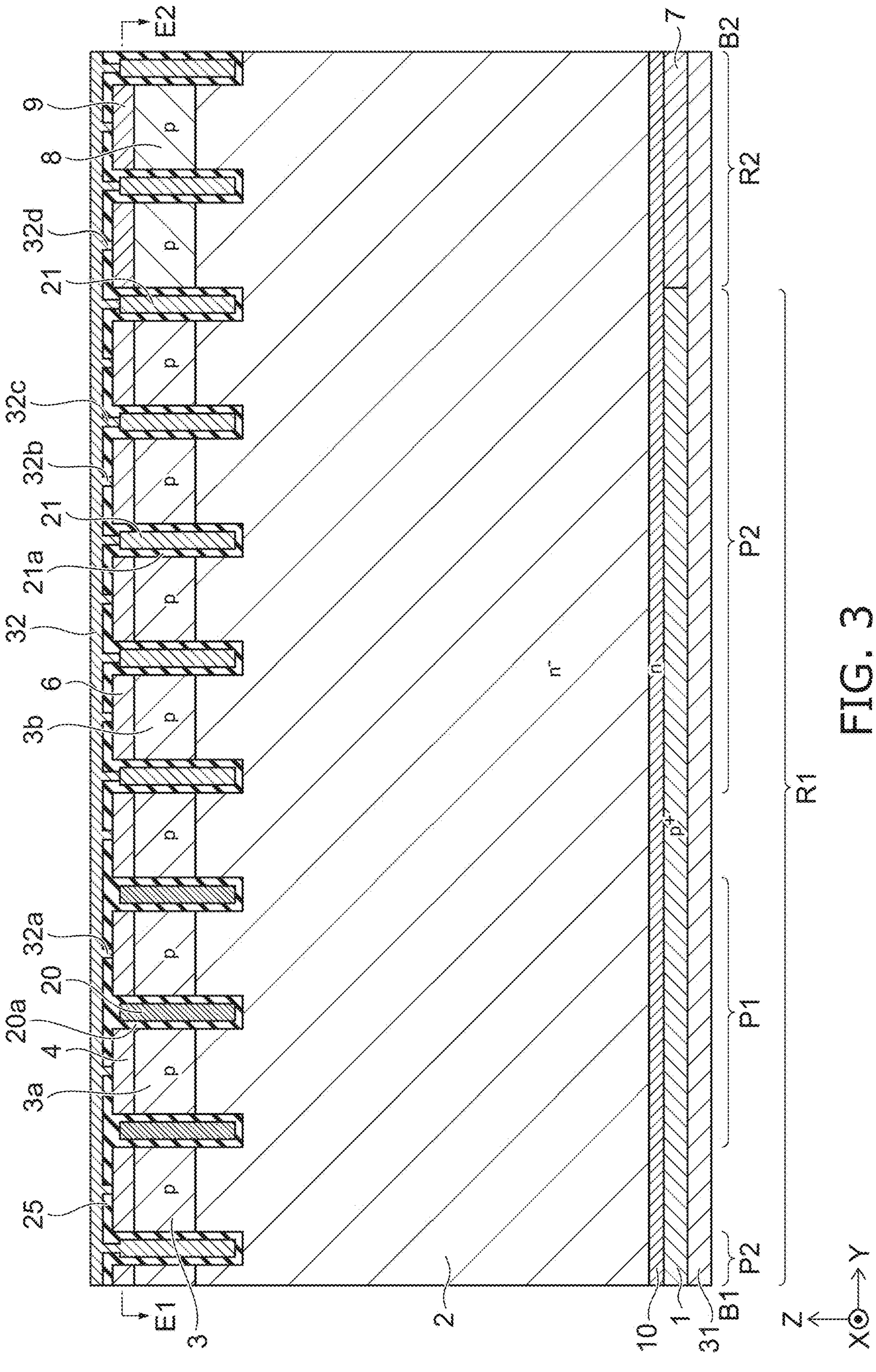
FIG. 3 is a B1-B2 cross-sectional view of FIG. 2.
Figure 4:
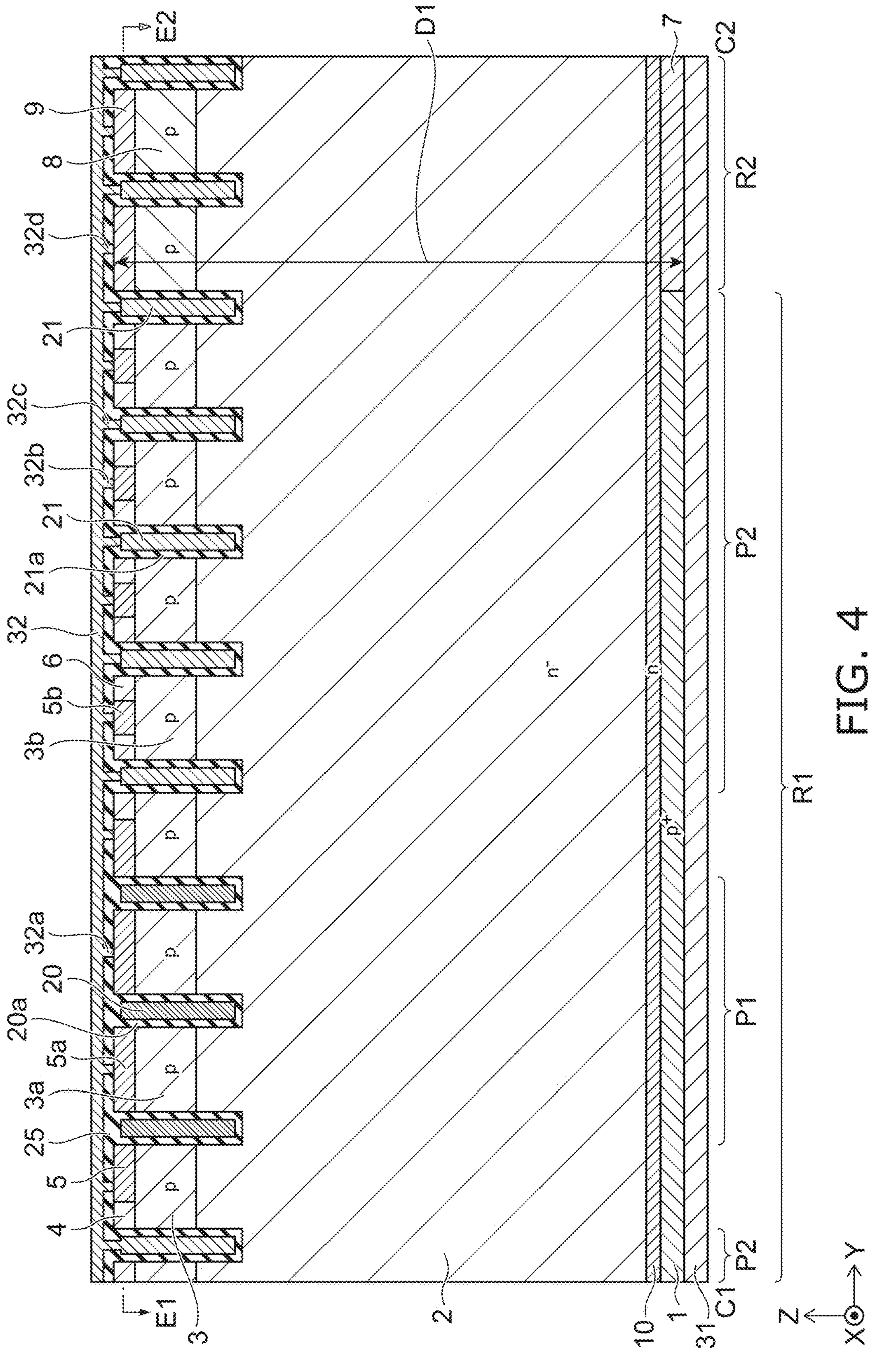
FIG. 4 is a C1-C2 cross-sectional view of FIG. 2.
Figure 5:
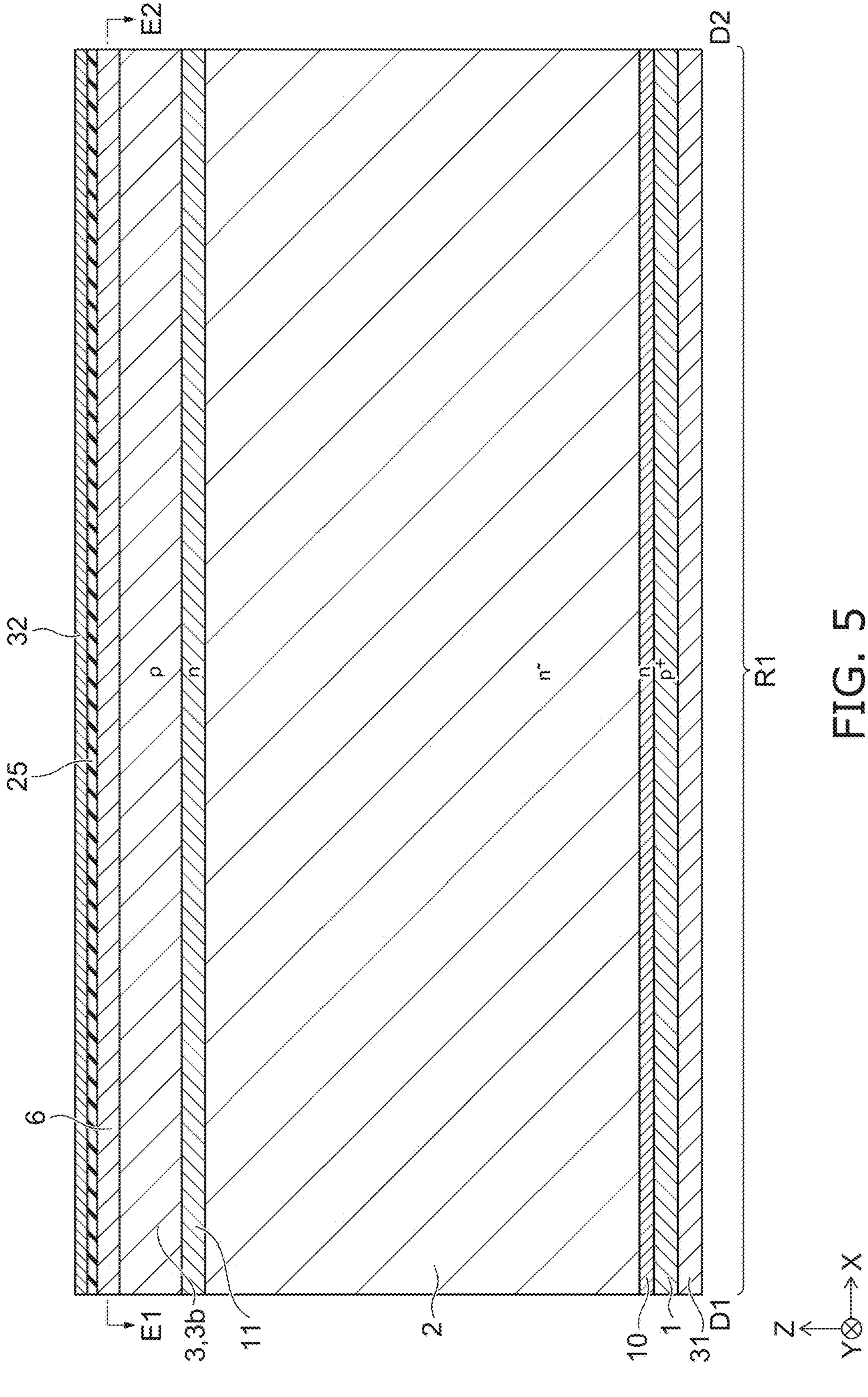
FIG. 5 is a D1-D2 cross-sectional view of FIG. 2.

FIG. 1 is a plan view of a semiconductor device according to an embodiment. FIG. 2 is an enlarged plan view of portion A of FIG. 1. FIG. 3 is a B1-B2 cross-sectional view of FIG. 2. FIG. 4 is a C1-C2 cross-sectional view of FIG. 2. FIG. 5 is a D1-D2 cross-sectional view of FIG. 2. FIG. 2 corresponds to an E1-E2 cross-sectional view of FIGS. 3 to 5.

The semiconductor device according to the embodiment is an RC-IGBT. As shown in FIGS. 1 to 5, the semiconductor device 100 according to the embodiment includes a $p^+$-type (first-conductivity-type) collector region 1 (a first semiconductor region), an $n^-$-type (second-conductivity-type) base region 2 (a second semiconductor region), a p-type base region 3 (a third semiconductor region), an $n^+$-type emitter region 4 (a fourth semiconductor region), a $p^+$-type contact region 5 (a fifth semiconductor region), an $n^+$-type semiconductor region 6 (a sixth semiconductor region), an $n^+$-type cathode region 7 (a seventh semiconductor region), a p-type anode region 8 (an eighth semiconductor region), a $p^+$-type anode region 9, a gate electrode 20, a conductive part 21, an insulating layer 25, a collector electrode 31 (a first electrode), an emitter electrode 32 (a second electrode), and a gate pad 33.

An XYZ orthogonal coordinate system is used in the description of embodiments. The direction from the collector electrode 31 toward the emitter electrode 32 is taken as a Z-direction (a first direction). Two mutually-orthogonal directions perpendicular to the Z-direction are taken as an X-direction (a third direction) and a Y-direction (a second direction). In the description, the direction from the collector electrode 31 toward the emitter electrode 32 is called "up", and the opposite direction is called "down". These directions are based on the collector electrode 31 and the relative positional relationship of the emitter electrode 32 and are independent of the direction of gravity.

As shown in FIG. 1, the emitter electrode 32 and the gate pad 33 are located at the upper surface of the semiconductor device 100. The emitter electrode 32 and the gate pad 33 are separated from each other. For example, multiple emitter electrodes 32 are arranged in the X-direction. A gate wiring part 33*a* is located around the emitter electrodes 32. A portion of the gate wiring part 33*a* extends in the Y-direction between the emitter electrodes 32. The gate wiring part 33*a* is electrically connected with the gate pad 33.

As shown in FIGS. 1 and 2, the semiconductor device 100 includes an IGBT region R1 (a first region) and a diode region R2 (a second region). In the example shown in FIG. 1, multiple IGBT regions R1 and multiple diode regions R2 are arranged in the X-direction and the Y-direction. The IGBT region R1 and the diode region R2 are alternately arranged in the Y-direction.

As shown in FIGS. 3 to 5, the collector electrode 31 is located at the lower surface of the semiconductor device 100. The collector electrode 31 and the emitter electrode 32 are separated from each other; and the multiple IGBT regions R1 and the multiple diode regions R2 are positioned between the collector electrode 31 and the emitter electrode 32.

As shown in FIGS. 2 to 5, the $p^+$-type collector region 1, a portion of the n-type base region 2, the p-type base region 3, the $n^+$-type emitter region 4, the $p^+$-type contact region 5, the $n^+$-type semiconductor region 6, the gate electrode 20, and the conductive part 21 are located in each IGBT region R1.

As shown in FIGS. 3 to 5, the $p^+$-type collector region 1 is located on a portion of the collector electrode 31 and is electrically connected with the collector electrode 31. A portion of the n-type base region 2 is located on the $p^+$-type collector region 1. The p-type base region 3 is located on the portion of the n-type base region 2 and positioned on the $p^+$-type collector region 1.

Multiple p-type base regions 3 are arranged in the Y-direction. Each p-type base region 3 extends in the X-direction. The multiple p-type base regions 3 are provided in stripe shapes when viewed along the Z-direction. As shown in FIGS. 3 and 4, the multiple p-type base regions 3 include a p-type base region 3*a* and a p-type base region 3*b*. The p-type base region 3*a* is one of the multiple p-type base regions 3. The p-type base region 3*b* is another one of the multiple p-type base regions 3.

The gate electrode 20 faces the p-type base region 3*a* via a gate insulating layer 20*a* in the Y-direction. The conductive part 21 faces the p-type base region 3*b* via an insulating layer 21*a* in the Y-direction. The $n^+$-type emitter region 4 and the $p^+$-type contact region 5 are located on the p-type base region 3*a*. The p-type impurity concentration of the $p^+$-type contact region 5 is greater than the p-type impurity concentration of the p-type base region 3. The $n^+$-type semiconductor region 6 is located on the p-type base region 3*b*.

Pluralities of the $n^+$-type emitter regions 4, the $p^+$-type contact regions 5, the $n^+$-type semiconductor regions 6, the gate electrodes 20, and the conductive parts 21 are arranged in the Y-direction. Specifically, the multiple gate electrodes 20 respectively face the multiple p-type base regions 3*a* in the Y-direction. The multiple $n^+$-type emitter regions 4 are positioned respectively on the multiple p-type base regions 3*a*. The multiple $p^+$-type contact regions 5 are positioned respectively on the multiple p-type base regions 3*a*. The multiple conductive parts 21 respectively face the multiple p-type base regions 3*b* in the Y-direction. The multiple $n^+$-type semiconductor regions 6 are positioned respectively on the multiple p-type base regions 3*b*. As illustrated, other multiple $p^+$-type contact regions 5 may be located respectively on the multiple p-type base regions 3*b*.

In the illustrated example, the multiple $p^+$-type contact regions 5 include a $p^+$-type contact region 5*a* and a $p^+$-type contact region 5*b*. The $p^+$-type contact region 5*a* is one of the multiple $p^+$-type contact regions 5. The $p^+$-type contact region 5*b* is another one of the multiple $p^+$-type contact regions 5. Each gate electrode 20 and each conductive part 21 extend in the X-direction. The multiple gate electrodes 20 and the multiple conductive parts 21 are provided in stripe shapes when viewed along the Z-direction. The $n^+$-type emitter region 4 and the $p^+$-type contact region 5*a* are alternately arranged in the X-direction on one p-type base region 3*a*. Multiple $p^+$-type contact regions 5*b* are arranged in the X-direction on one p-type base region 3*b*. The $n^+$-type semiconductor region 6 is provided around the $p^+$-type contact regions 5*b* along the X-Y plane (a first plane) on one p-type base region 3*b*.

As shown in FIG. 2, a length L2 in the X-direction of the $n^+$-type semiconductor region 6 is greater than a length L1 in the X-direction of the $n^+$-type emitter region 4. The area of the $n^+$-type semiconductor region 6 per unit area is greater than the area of the $n^+$-type emitter region 4 per unit area in the X-Y plane.

A length L4 in the Y-direction of the $p^+$-type contact region 5*b* is less than a length L3 in the Y-direction of the $p^+$-type contact region 5*a*. The area of the $p^+$-type contact region 5*b* per unit area is less than the area of the $p^+$-type contact region 5*a* per unit area in the X-Y plane.

For example, as shown in FIGS. 2 to 4, the IGBT region R1 includes a first part P1 and a second part P2. The p-type base region 3*a*, the $n^+$-type emitter region 4, the $p^+$-type contact region 5*a*, and the gate electrode 20 are located in the first part P1. The p-type base region 3*b*, the $p^+$-type contact region 5*b*, the $n^+$-type semiconductor region 6, and the conductive part 21 are located in the second part P2.

In the illustrated example, the first part P1 and the second part P2 are alternately arranged in the Y-direction in the IGBT region R1. One second part P2 is positioned between the diode region R2 and one first part P1 at the vicinity of the boundary between the IGBT region R1 and the diode region R2. The position of the boundary between the IGBT region R1 and the diode region R2 in the X-Y plane corresponds to the position of the boundary between the $p^+$-type collector region 1 and the $n^+$-type cathode region 7 in the X-Y plane.

The emitter electrode 32 is electrically connected with the p-type base region 3, the $n^+$-type emitter region 4, the $p^+$-type contact region 5, the $n^+$-type semiconductor region 6, and the conductive part 21 in the IGBT region R1. More specifically, the emitter electrode 32 includes contact parts 32*a* to 32*d* protruding toward the collector electrode 31. In FIG. 2, the contact parts 32*a* to 32*d* are illustrated by broken lines. The contact part 32*a* is positioned on the p-type base region 3*a* and contacts the $n^+$-type emitter region 4 and the $p^+$-type contact region 5*a*. The contact part 32*b* is positioned on the p-type base region 3*b* and contacts the $p^+$-type contact region 5*b* and the $n^+$-type semiconductor region 6. The contact part 32*c* is positioned on the conductive part 21 and contacts the conductive part 21.

The X-direction end portion of the gate electrode 20 is electrically connected with the gate wiring part 33*a*. The gate electrode 20 is electrically connected with the gate pad 33 via the gate wiring part 33*a*. The insulating layer 25 is located between the gate electrode 20 and the emitter electrode 32. The gate electrode 20 and the emitter electrode 32 are electrically isolated from each other by the insulating layer 25.

The $n^+$-type cathode region 7, another portion of the $n^-$-type base region 2, the p-type anode region 8, the $p^+$-type anode region 9, and the conductive part 21 are located in each diode region R2.

The $n^+$-type cathode region 7 is located on another portion of the collector electrode 31 and is electrically connected with the collector electrode 31. Another portion of the n-type base region 2 is located on the $n^+$-type cathode region 7. The n-type impurity concentration of the $n^+$-type cathode region 7 is greater than the n-type impurity concentration of the n'-type base region 2. The p-type anode region 8 is located on the other portion of the $n^-$-type base region 2 and positioned on the $n^+$-type cathode region 7.

The conductive part 21 faces the p-type anode region 8 via the insulating layer 21*a* in the Y-direction. The $p^+$-type anode region 9 is located on the p-type anode region 8. The p-type impurity concentration of the $p^+$-type anode region 9 is greater than the p-type impurity concentration of the p-type anode region 8.

The emitter electrode 32 is electrically connected with the p-type anode region 8, the $p^+$-type anode region 9, and the conductive part 21 in the diode region R2. The contact part 32*c* of the emitter electrode 32 contacts the conductive part 21. The contact part 32*d* contacts the p-type anode region 8 and the $p^+$-type anode region 9.

Pluralities of the p-type anode regions 8, the $p^+$-type anode regions 9, and the conductive parts 21 are arranged in the Y-direction in the one diode region R2. Each p-type anode region 8 and each conductive part 21 extend in the X-direction. The multiple p-type anode regions 8 and the multiple conductive parts 21 are provided in stripe shapes when viewed along the Z-direction. Multiple $p^+$-type anode regions 9 also are arranged in the X-direction on one p-type anode region 8.

Operations of the semiconductor device 100 will now be described.

A voltage that is not less than a threshold is applied to the gate electrode 20 in a state in which a positive voltage with respect to the emitter electrode 32 is applied to the collector electrode 31. A channel (an inversion layer) is thereby formed in the p-type base region 3. Electrons flow from the $n^+$-type emitter region 4 to the n-type base region 2 via the channel; and holes flow from the $p^+$-type collector region 1 toward the n-type base region 2. The density of the carriers accumulated in the n'-type base region 2 increases, and conductivity modulation occurs. The electrical resistance in the n-type base region 2 is greatly reduced thereby, and the IGBT region R1 is set to the on-state. Subsequently, when the voltage applied to the gate electrode 20 drops below the threshold, the channel in the p-type base region 3 disappears, and the IGBT region R1 is switched to the off-state.

After the IGBT region R1 is switched to the off-state, the electrons that accumulated in the $n^-$-type base region 2 are discharged to the collector electrode 31 via the $p^+$-type collector region 1. The holes are discharged to the emitter electrode 32 via the p-type base region 3.

For example, a bridge circuit is configured using the multiple semiconductor devices 100. When one semiconductor device 100 is switched from the on-state to the off-state, the inductance component of the bridge circuit applies an induced electromotive force to the emitter electrode 32 of another semiconductor device 100. As a result, the diode region R2 of the other semiconductor device 100 operates. Holes flow from the p-type anode region 8 to the n-type base region 2; and electrons flow from the $n^+$-type cathode region 7 to the $n^-$-type base region 2. The diode region R2 functions as a freewheeling diode (FWD).

As shown in FIGS. 3 to 5, an n-type channel stopper region 10 may be provided between the $p^+$-type collector region 1 and the $n^-$-type base region 2 and between the $n^+$-type cathode region 7 and the $n^-$-type base region 2. The n-type impurity concentration of the n-type channel stopper region 10 is less than the n-type impurity concentration of the $n^+$-type cathode region 7 and greater than the n-type impurity concentration of the $n^-$-type base region 2. By providing the n-type channel stopper region 10, the spreading of the depletion layer in the n-type base region 2 can be more reliably suppressed by the n-type channel stopper region 10.

Examples of the materials of the components of the semiconductor device 100 will now be described.

The $p^+$-type collector region 1, the $n^-$-type base region 2, the p-type base region 3, the $n^+$-type emitter region 4, the $p^+$-type contact region 5, the $n^+$-type semiconductor region 6, the $n^+$-type cathode region 7, the p-type anode region 8, the $p^+$-type anode region 9, and the n-type channel stopper region 10 include silicon, silicon carbide, gallium nitride, or gallium arsenide as a semiconductor material. When silicon is used as the semiconductor material, arsenic, phosphorus, or antimony can be used as an n-type impurity. Boron can be used as a p-type impurity.

The gate electrode 20 and the conductive part 21 include conductive materials such as polysilicon, etc. The gate insulating layer 20*a*, the insulating layer 21*a*, and the insulating layer 25 include insulating materials such as silicon oxide, silicon nitride, silicon oxynitride, etc. The collector electrode 31, the emitter electrode 32, the gate pad 33, and the gate wiring part 33*a* include metals such as titanium, aluminum, etc.

Figure 6:
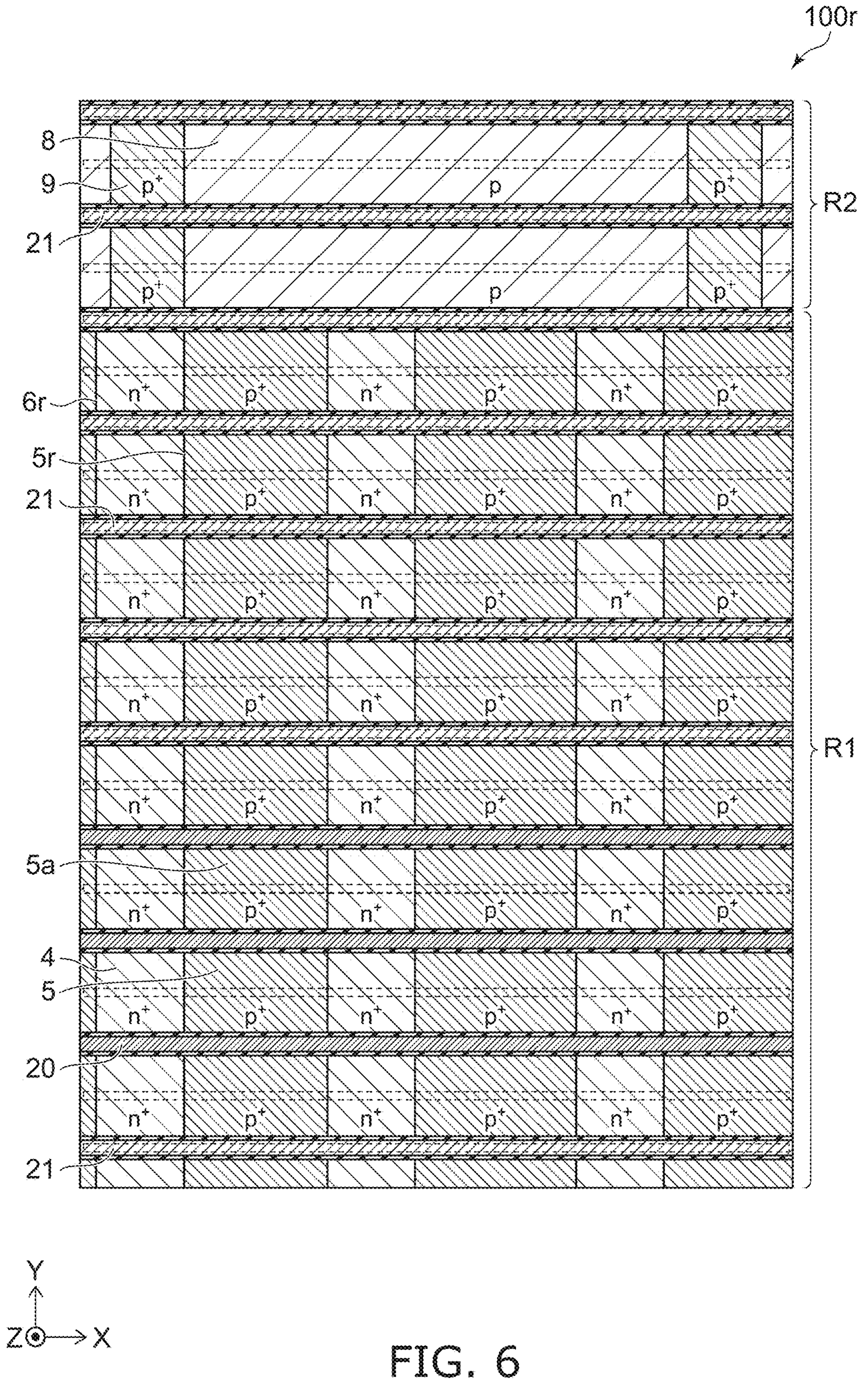
FIG. 6 is a plan view showing a portion of a semiconductor device according to a reference example.
Figure 7:
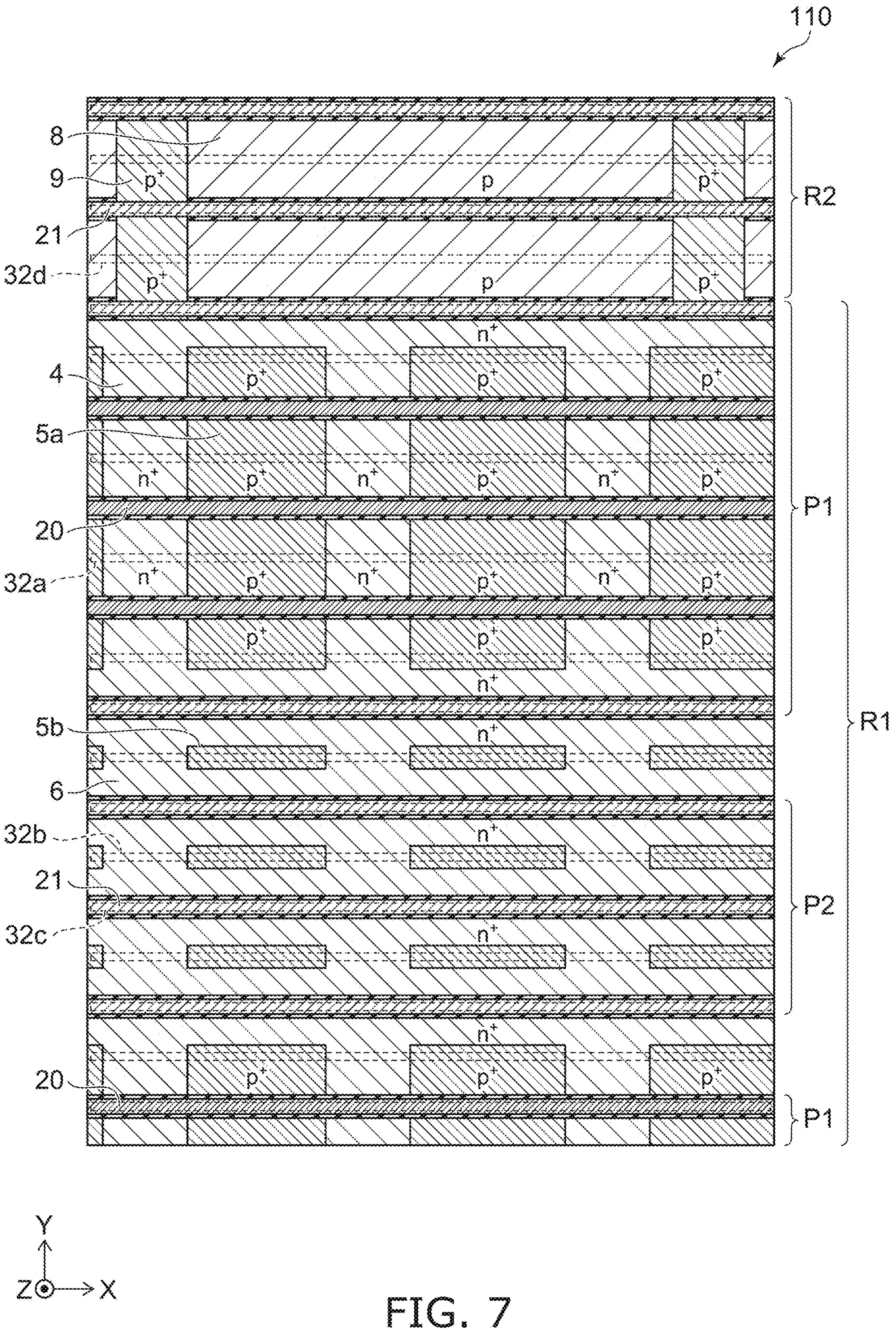
FIG. 7 is a plan view showing a portion of a semiconductor device according to a modification of the embodiment.

FIG. 6 is a plan view showing a portion of a semiconductor device according to a reference example.

Compared to the semiconductor device 100, the semiconductor device 100*r* according to the reference example shown in FIG. 6 includes a $p^+$-type contact region 5*r* and an $n^+$-type semiconductor region 6*r* instead of the $p^+$-type contact region 5 and the $n^+$-type semiconductor region 6. The $p^+$-type contact region 5*r* and the $n^+$-type semiconductor region 6*r* are located on the p-type base region 3*b* (not illustrated in FIG. 6) that faces the conductive part 21. The X-direction length of the $p^+$-type contact region 5r is equal to the X-direction length of the $p^+$-type contact region 5. The X-direction length of the $n^+$-type semiconductor region 6r is equal to the X-direction length of the $n^+$-type emitter region 4.

Advantages of the embodiment will now be described.

The semiconductor device 100r includes a parasitic thyristor made of the $p^+$-type collector region 1, the $n^-$-type base region 2, the p-type base region 3, and the $n^+$-type emitter region 4. When the IGBT region R1 is switched to the off-state, holes flow in the p-type base region 3. The parasitic thyristor may operate when the flow of holes causes the potential of the p-type base region 3 to increase. When the parasitic thyristor operates, a large current flows in the semiconductor device 100r, and breakdown of the semiconductor device 100r occurs.

In the semiconductor device 100r, the $p^+$-type contact region 5 and the $p^+$-type contact region 5r are provided to suppress the operation of the parasitic thyristor. The p-type impurity concentrations of the $p^+$-type contact region 5 and the $p^+$-type contact region 5r are greater than the p-type impurity concentration of the p-type base region 3. When holes flow in the p-type base region 3, the holes are easily discharged to the emitter electrode 32 via the $p^+$-type contact region 5 and the $p^+$-type contact region 5r. The operation of the parasitic thyristor can be suppressed thereby. In other words, the latchup withstand capacity of the semiconductor device 100r can be improved.

On the other hand, the IGBT region R1 also includes a parasitic diode made of the n-type base region 2 and the p-type base region 3. When the diode region R2 is in the on-state, the parasitic diode of the IGBT region R1 may operate and cause holes to flow from the emitter electrode 32 to the $n^-$-type base region 2. In particular, more holes flow toward the $n^-$-type base region 2 because the electrical resistance between the $p^+$-type contact region 5 and the emitter electrode 32 and the electrical resistance between the $p^+$-type contact region 5r and the emitter electrode 32 are low. The carriers that accumulate in the $n^-$-type base region 2 are increased thereby. When the diode region R2 is switched to the off-state, more time is necessary for the carriers accumulated in the n-type base region 2 to be discharged. As a result, the switching of the diode region R2 from the on-state to the off-state is slower. The operation speed of the diode region R2 is reduced, and the switching loss of the semiconductor device 100r is increased.

For this problem, in the semiconductor device 100 according to the embodiment, the $n^+$-type semiconductor region 6 is provided instead of the $n^+$-type semiconductor region 6r in a portion of the IGBT region R1. The length L2 of the $n^+$-type semiconductor region 6 is greater than the length L1 of the $n^+$-type emitter region 4. When the diode region R2 operates, the electrons that are injected into the $n^-$-type base region 2 are discharged from the $n^+$-type semiconductor region 6 in addition to the p-type anode region 8 and the $p^+$-type anode region 9. When the $n^+$-type semiconductor region 6 that is longer than the $n^+$-type emitter region 4 is provided, more electrons can be discharged to the emitter electrode 32 via the $n^+$-type semiconductor region 6. Therefore, the density of the carriers accumulated in the $n^-$-type base region 2 when the diode region R2 operates can be reduced. As a result, the operation speed of the diode region R2 can be increased, and the switching loss of the semiconductor device 100 can be reduced.

When the diode region R2 operates, electrons also are discharged from the $n^+$-type emitter region 4. The density of the carriers accumulated in the $n^-$-type base region 2 when the diode region R2 operates also can be reduced by lengthening the $n^+$-type emitter region 4. However, the potential at the $n^+$-type emitter region 4 vicinity easily increases when the $n^+$-type emitter region 4 is lengthened with respect to the $p^+$-type contact region 5. As a result, the latchup withstand capacity of the semiconductor device 100 is reduced. The $n^+$-type semiconductor region 6 is located on the p-type base region 3b that faces the conductive part 21. In other words, a channel is not formed in the p-type base region 3b when the IGBT region R1 is in the on-state. Accordingly, the parasitic thyristor does not operate even when the potential of the p-type base region 3b increases when the IGBT region R1 is turned off. By lengthening the $n^+$-type semiconductor region 6 instead of the $n^+$-type emitter region 4, the switching loss of the semiconductor device 100 can be reduced while suppressing the reduction of the latchup withstand capacity of the semiconductor device 100.

As shown in FIG. 2, it is favorable for the length L4 of the $p^+$-type contact region 5b to be less than the length L3 of the $p^+$-type contact region 5a. When the diode region R2 operates, holes are injected via the $p^+$-type contact region 5 in the parasitic diode of the IGBT region R1. By setting the length L4 to be less than the length L3, the holes that are injected via the $p^+$-type contact region 5b can be suppressed. The density of the carriers accumulated in the $n^-$-type base region 2 can be further reduced thereby. The $p^+$-type contact region 5b is located on the p-type base region 3b. When the length L4 is short, the potential of the p-type base region 3b easily increases when the IGBT region R1 is turned off. However, as described above, the parasitic thyristor does not operate even when the potential of the p-type base region 3b increases. By setting the length L4 to be less than the length L3, the switching loss of the semiconductor device 100 can be further reduced while further suppressing the reduction of the latchup withstand capacity.

An element that is at least one selected from the group consisting of hydrogen, helium, and platinum may be ion-implanted into the $n^-$-type base region 2 in at least one of the IGBT region R1 or the diode region R2. By implanting the element into the $n^-$-type base region 2, the lifetime in the n-type base region 2 can be reduced. The switching loss of the semiconductor device 100 can be further reduced thereby. An electron beam may be irradiated on the $n^-$-type base region 2 instead of implanting the element. Crystal defects are formed in the n-type base region 2 by the irradiation of the electron beam. The lifetime of the $n^-$-type base region 2 decreases as the density of the crystal defect increases.

FIGS. 7 to 11 are plan views showing portions of semiconductor devices according to modifications of the embodiment.

The arrangement of the first and second parts P1 and P2 is not limited to the example shown in FIGS. 2 to 4 and is modifiable as appropriate. For example, in the semiconductor device 110 shown in FIG. 7, the first part P1 is positioned between the second part P2 and the diode region R2 at the vicinity of the boundary between the IGBT region R1 and the diode region R2. The $n^+$-type semiconductor region 6 that is longer than the $n^+$-type emitter region 4 is located on the p-type base region 3b regardless of the position of the first part P1 and the position of the second part P2. As a result, the switching loss of the semiconductor device 110 can be reduced while suppressing the reduction of the latchup withstand capacity of the semiconductor device 110.

However, it is more favorable for the second part P2 to be positioned between the first part P1 and the diode region R2 as shown in FIG. 2. The discharge of the electrons via the $n^+$-type semiconductor region 6 increases as the second part P2 approaches the diode region R2. The injection of the holes via the $p^+$-type contact region 5*a* can be suppressed by separating the first part P1 from the diode region R2. The density of the carriers accumulated in the n-type base region 2 can be further reduced thereby.

Figure 8:
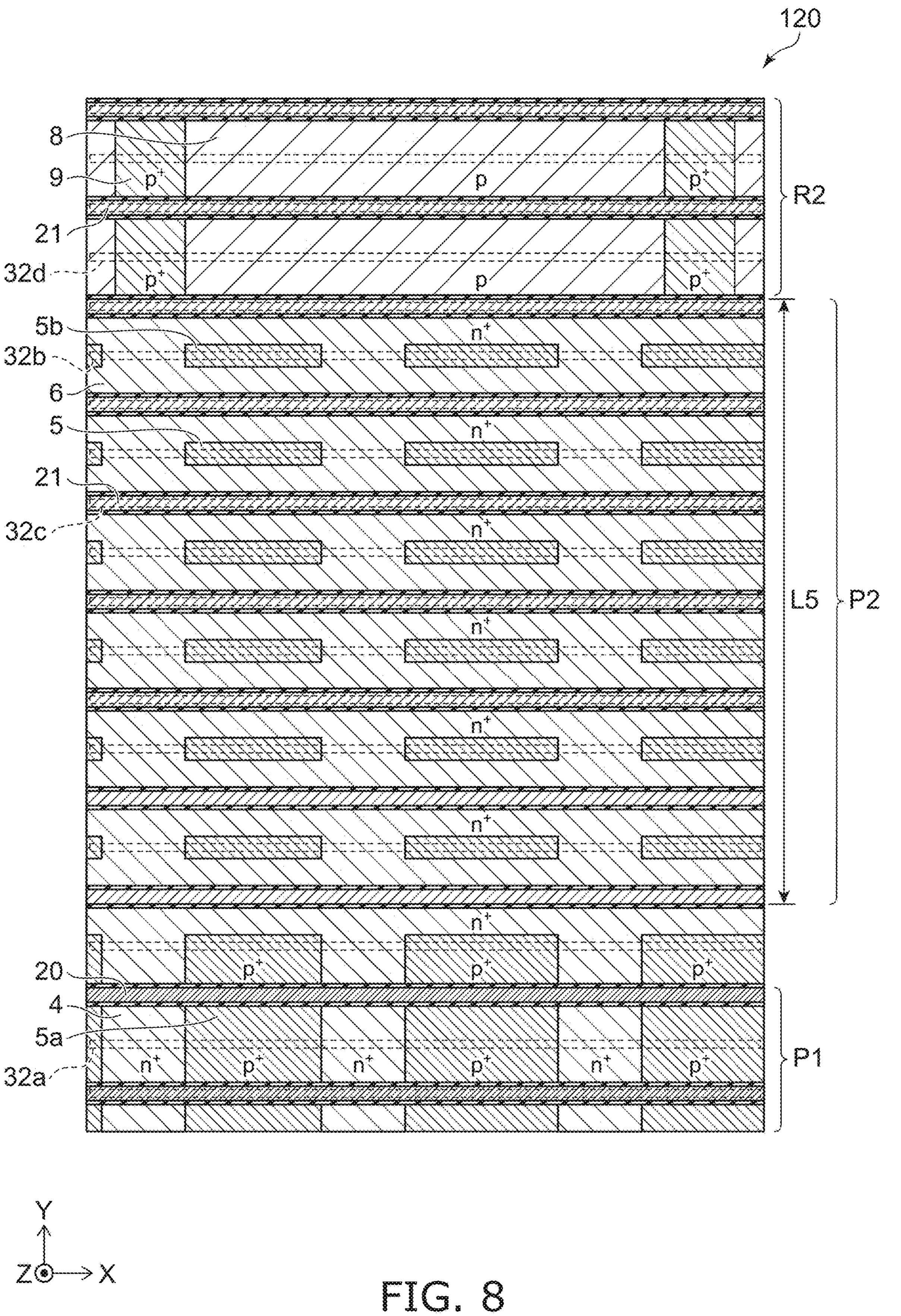
FIG. 8 is a plan view showing a portion of a semiconductor device according to a modification of the embodiment.

The number of the p-type base regions 3*a*, the number of the gate electrodes 20, etc., provided in one first part P1 are arbitrary. The number of the p-type base regions 3*a*, the number of the gate electrodes 20, etc., may be different between the first parts P1. The number of the p-type base regions 3*b*, the number of the conductive parts 21, etc., provided in one second part P2 are arbitrary. The number of the p-type base regions 3*b*, the number of the conductive parts 21, etc., may be different between the second parts P2. In the semiconductor device 120 shown in FIG. 8, compared to the semiconductor device 100 shown in FIG. 2, more conductive parts 21 are provided in one second part P2.

Favorably, a length L5 in the Y-direction of the second part P2 is greater than a distance D1 in the Z-direction between the collector electrode 31 and the emitter electrode 32 (shown in FIG. 4). When the length L5 is greater than the distance D1, the first part P1 can be sufficiently separated from the diode region R2. Holes flow less easily from the parasitic diode of the first part P1 toward the $n^+$-type cathode region 7 of the diode region R2 as the distance between the first part P1 and the diode region R2 increases. When the diode region R2 operates, the injection of holes from the $p^+$-type contact region 5*a* toward the $n^-$-type base region 2 can be suppressed. By providing a sufficiently long second part P2, the discharge of the electrons via the $n^+$-type semiconductor region 6 when the diode region R2 operates can be promoted. The switching loss of the semiconductor device 120 can be further reduced thereby.

Figure 9:
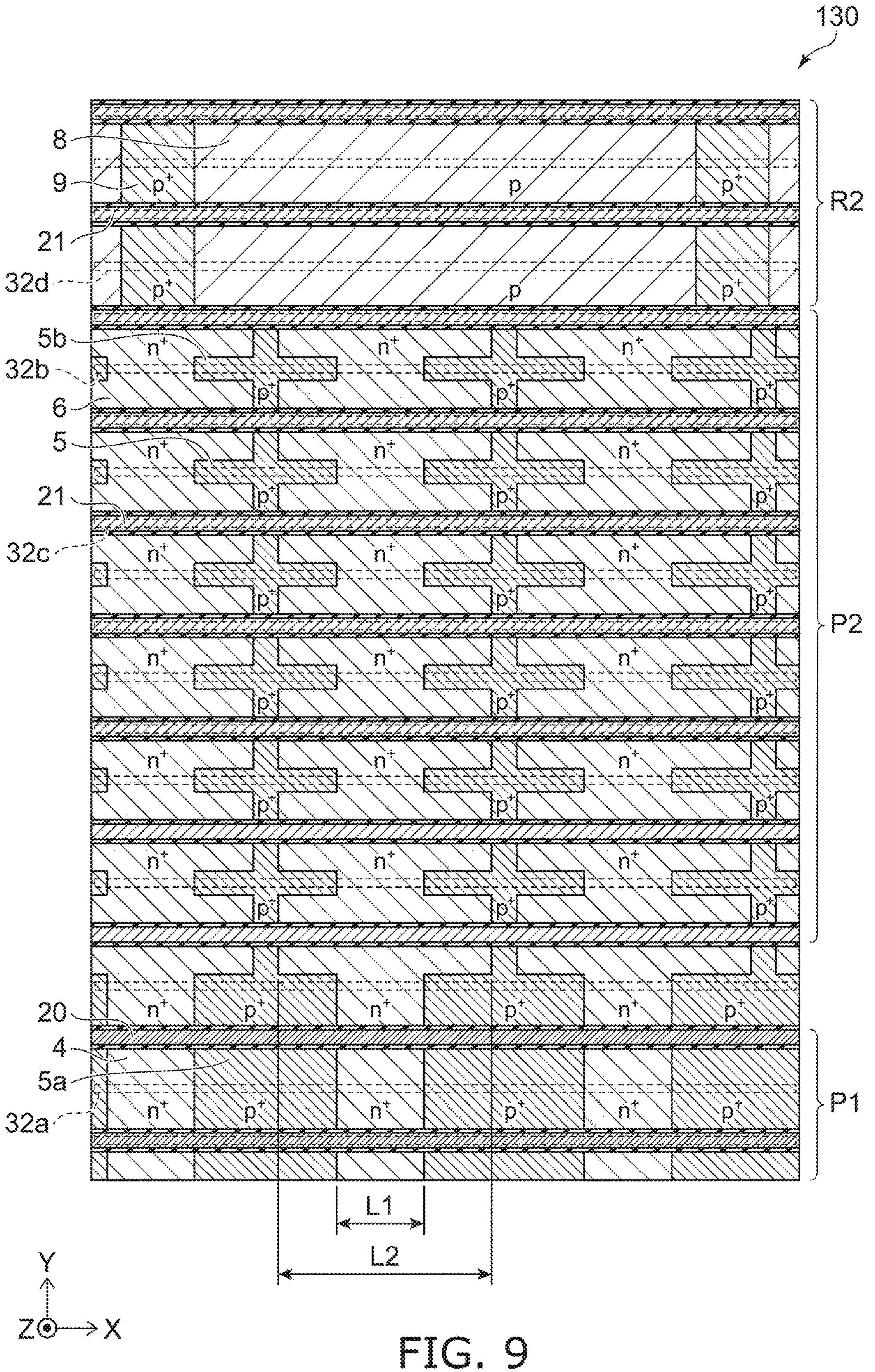
FIG. 9 is a plan view showing a portion of a semiconductor device according to a modification of the embodiment.

As in the semiconductor device 130 shown in FIG. 9, the $p^+$-type contact region 5*b* and the $n^+$-type semiconductor region 6 may be different from those of the semiconductor device 100. In the semiconductor device 130, the $p^+$-type contact region 5*b* and the $n^+$-type semiconductor region 6 are alternately arranged in the X-direction on the not-illustrated p-type base region 3*b*. However, the length L2 in the X-direction of the $n^+$-type semiconductor region 6 is greater than the length L1 in the X-direction of the $n^+$-type emitter region 4. According to the semiconductor device 130, similarly to the semiconductor device 100, the switching loss can be reduced while suppressing the reduction of the latchup withstand capacity.

More favorably, as in the semiconductor device 100 shown in FIG. 2, one large $n^+$-type semiconductor region 6 is provided around the $p^+$-type contact regions 5*b*. According to the structure shown in FIG. 2, the area of the $n^+$-type semiconductor region 6 per unit area in the X-Y plane can be increased, and the area of the $p^+$-type contact region 5*b* per unit area in the X-Y plane can be reduced. The carriers accumulated in the n-type base region 2 when the diode region R2 operates decrease as the area of the $n^+$-type semiconductor region 6 increases, or as the area of the $p^+$-type contact region 5*b* decreases. Therefore, according to the structure of the semiconductor device 100, compared to the structure of the semiconductor device 130, the switching loss can be further reduced.

Figure 10:
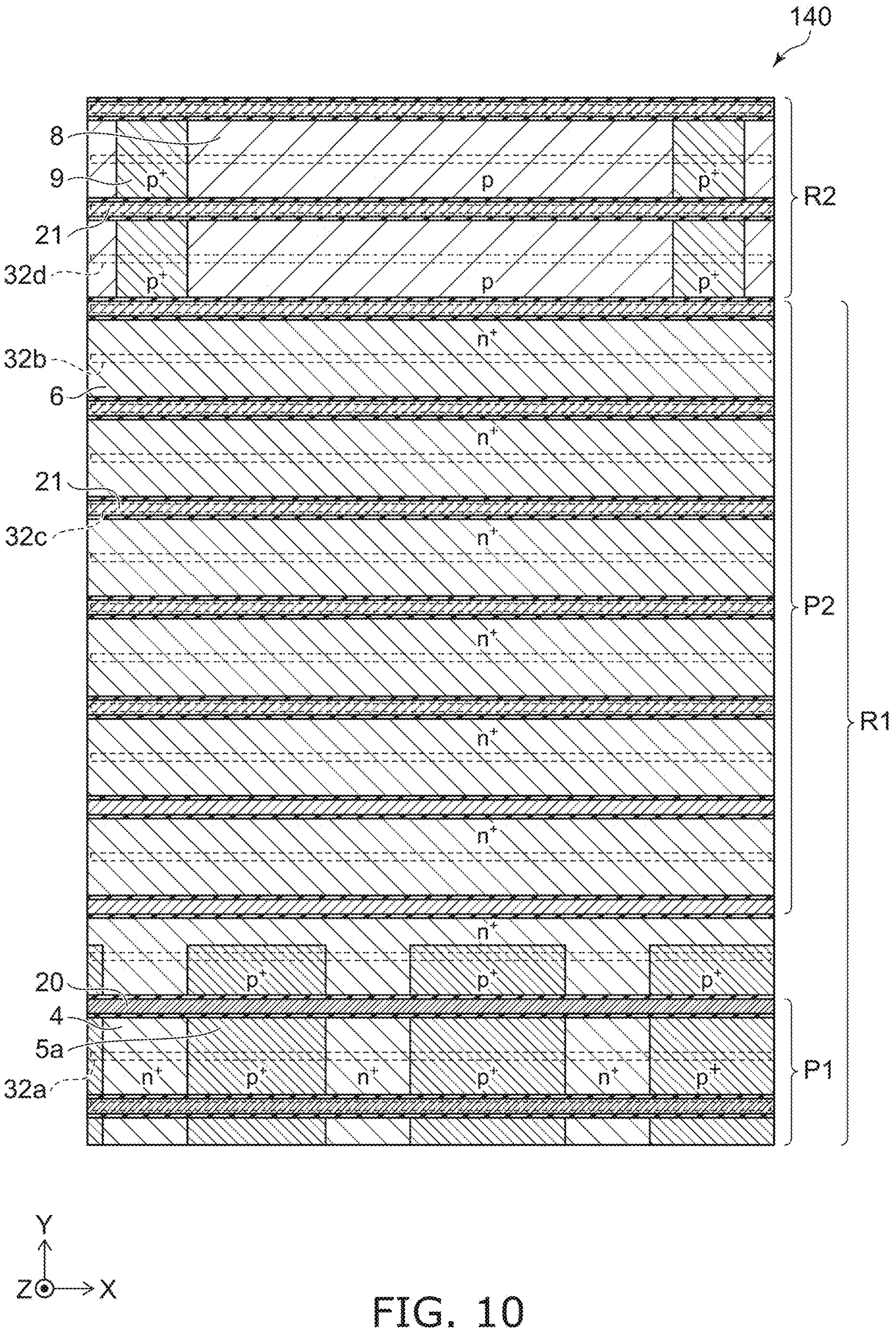
FIG. 10 is a plan view showing a portion of a semiconductor device according to a modification of the embodiment.

As in the semiconductor device 140 shown in FIG. 10, the $p^+$-type contact region 5*b* may be omitted from the second part P2. In the semiconductor device 140, the $n^+$-type semiconductor region 6 is provided over the entire p-type base region 3*b*. According to the semiconductor device 140, compared to the structure of the semiconductor device 100, the switching loss can be further reduced.

Figure 11:
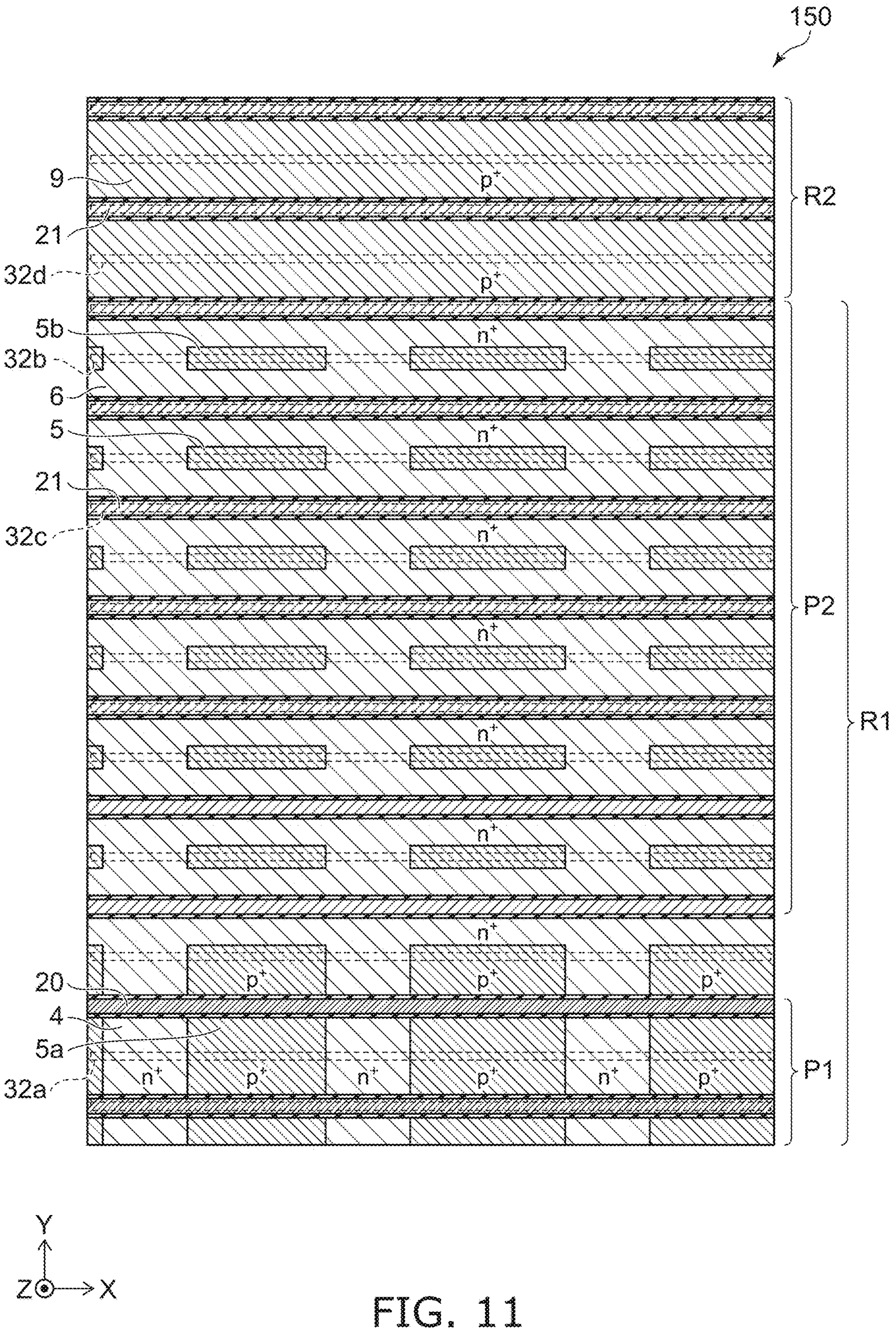
FIG. 11 is a plan view showing a portion of a semiconductor device according to a modification of the embodiment.

As in the semiconductor device 150 shown in FIG. 11, the $p^+$-type anode region 9 may be provided over the entire surface of the p-type anode region 8 in the diode region R2. More carriers are injected into the n-type base region 2 when the diode region R2 operates as the area of the $p^+$-type anode region 9 increases. According to the semiconductor device 150, compared to the structure of the semiconductor device 120, the on-resistance when the diode region R2 operates can be reduced.

On the other hand, when the injection of carriers into the $n^-$-type base region 2 is increased, the carriers that accumulate in the $n^-$-type base region 2 also increase. As a result, the switching loss of the semiconductor device 150 may increase. However, according to the embodiment of the invention, more electrons can be discharged to the emitter electrode 32 via the $n^+$-type semiconductor region 6 when the diode region R2 operates. An increase of the switching loss of the semiconductor device 150 can be suppressed even when the area of the $p^+$-type anode region 9 is increased.

Embodiments of the invention include the following configurations.

(Configuration 1)

A semiconductor device, comprising:

a first electrode;

a second electrode separated from the first electrode;

a first region located on a portion of the first electrode and positioned between the first electrode and the second electrode, the first region including a first semiconductor region of a first conductivity type, a second semiconductor region of a second conductivity type, a portion of the second semiconductor region being located on the first semiconductor region, a plurality of third semiconductor regions located on the portion of the second semiconductor region, the plurality of third semiconductor regions being of the first conductivity type, a gate electrode facing one of the plurality of third semiconductor regions via a gate insulating layer in a second direction perpendicular to a first direction, the first direction being from the first electrode toward the second electrode, a conductive part facing an other one of the plurality of third semiconductor regions via an insulating layer in the second direction, the conductive part being electrically connected with the second electrode, a fourth semiconductor region located on the one of the plurality of third semiconductor regions, the fourth semiconductor region being of the second conductivity type, a fifth semiconductor region located on the one of the plurality of third semiconductor regions, the fifth semiconductor region being of the first conductivity type, a first-conductivity-type impurity concentration of the fifth semiconductor region being greater than a first-conductivity-type impurity concentration of the one of the plurality of third semiconductor regions, and a sixth semiconductor region located on the other one of the plurality of third semiconductor regions, the sixth semiconductor region being of the second conductivity type, a length of the sixth semiconductor region in a third direction being greater than a length of the fourth semiconductor region in the third direction, the third direction being perpendicular to the first and second directions; and a second region located on an other portion of the first electrode and positioned between the first electrode and the second electrode, the second region including a seventh semiconductor region of the second conductivity type, the seventh semiconductor region having a higher second-conductivity-type impurity concentration than the second semiconductor region, an other portion of the second semiconductor region located on the seventh semiconductor region, and an eighth semiconductor region located on the other portion of the second semiconductor region, the eighth semiconductor region being of the first conductivity type.

(Configuration 2)

The device according to Configuration 1, wherein the fourth semiconductor region and the fifth semiconductor region are alternately arranged in the third direction.

(Configuration 3)

The device according to Configuration 1 or 2, wherein the fifth semiconductor regions are provided respectively on the plurality of third semiconductor regions, and a length in the second direction of the fifth semiconductor region positioned on the other one of the plurality of third semiconductor regions is less than a length in the second direction of an other of the fifth semiconductor regions positioned on the one of the plurality of third semiconductor regions.

(Configuration 4)

The device according to Configuration 3, wherein a plurality of the fifth semiconductor regions is arranged in the third direction on the other one of the plurality of third semiconductor regions, and the sixth semiconductor region is located around the plurality of fifth semiconductor regions along a first plane perpendicular to the first direction.

(Configuration 5)

The device according to any one of Configurations 1 to 4, wherein the first region includes:

a first part in which the gate electrode, the fifth semiconductor region, the fourth semiconductor region, and the one of the plurality of third semiconductor regions are located; and a second part in which the conductive part, the sixth semiconductor region, and the other one of the plurality of third semiconductor regions are located, and the second part is positioned between the first part and the second region.

(Configuration 6)

The device according to Configuration 5, wherein a length in the second direction of the second part is greater than a distance in the first direction between the first electrode and the second electrode.

According to the embodiments described above, a semiconductor device is provided in which the switching loss can be reduced.

In the embodiments, the relative level of impurity concentration between the semiconductor regions can be confirmed by, for example, using SCM (Scanning Capacitance Microscope). The carrier concentration in each semiconductor region can be considered equal to the concentration of impurities activated in each semiconductor region. Accordingly, the relative level of the carrier concentration between the semiconductor regions can also be confirmed using the SCM. The impurity concentration in each semiconductor region can be measured by, for example, SIMS (Secondary Ion Mass Spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:

a first electrode;

a second electrode separated from the first electrode;

a first region located on a portion of the first electrode and positioned between the first electrode and the second electrode, the first region including a first semiconductor region of a first conductivity type, a second semiconductor region of a second conductivity type, a portion of the second semiconductor region being located on the first semiconductor region, a plurality of third semiconductor regions located on the portion of the second semiconductor region, the plurality of third semiconductor regions being of the first conductivity type, a gate electrode facing one of the plurality of third semiconductor regions via a gate insulating layer in a second direction perpendicular to a first direction, the first direction being from the first electrode toward the second electrode, a conductive part facing an other one of the plurality of third semiconductor regions via an insulating layer in the second direction, the conductive part being electrically connected with the second electrode, a fourth semiconductor region located on the one of the plurality of third semiconductor regions, the fourth semiconductor region being of the second conductivity type, a fifth semiconductor region located on the one of the plurality of third semiconductor regions, the fifth semiconductor region being of the first conductivity type, a first-conductivity-type impurity concentration of the fifth semiconductor region being greater than a first-conductivity-type impurity concentration of the one of the plurality of third semiconductor regions, and a sixth semiconductor region located on the other one of the plurality of third semiconductor regions, the sixth semiconductor region being of the second conductivity type, a length of the sixth semiconductor region in a third direction being greater than a length of the fourth semiconductor region in the third direction, the third direction being perpendicular to the first and second directions; and a second region located on an other portion of the first electrode and positioned between the first electrode and the second electrode, the second region including a seventh semiconductor region of the second conductivity type, the seventh semiconductor region having a higher second-conductivity-type impurity concentration than the second semiconductor region, an other portion of the second semiconductor region located on the seventh semiconductor region, and an eighth semiconductor region located on the other portion of the second semiconductor region, the eighth semiconductor region being of the first conductivity type.

2. The device according to claim 1, wherein the fourth semiconductor region and the fifth semiconductor region are alternately arranged in the third direction.

3. The device according to claim 1, wherein the fifth semiconductor regions are provided respectively on the plurality of third semiconductor regions, and a length in the second direction of the fifth semiconductor region positioned on the other one of the plurality of third semiconductor regions is less than a length in the second direction of an other of the fifth semiconductor regions positioned on the one of the plurality of third semiconductor regions.

4. The device according to claim 3, wherein a plurality of the fifth semiconductor regions is arranged in the third direction on the other one of the plurality of third semiconductor regions, and the sixth semiconductor region is located around the plurality of fifth semiconductor regions along a first plane perpendicular to the first direction.

5. The device according to claim 1, wherein the first region includes:

a first part in which the gate electrode, the fifth semiconductor region, the fourth semiconductor region, and the one of the plurality of third semiconductor regions are located; and a second part in which the conductive part, the sixth semiconductor region, and the other one of the plurality of third semiconductor regions are located, and the second part is positioned between the first part and the second region.

6. The device according to claim 5, wherein a length in the second direction of the second part is greater than a distance in the first direction between the first electrode and the second electrode.

7. The device according to claim 1, wherein the first region includes:

a first part in which the gate electrode, the fifth semiconductor region, the fourth semiconductor region, and the one of the plurality of third semiconductor regions are located; and a second part in which the conductive part, the sixth semiconductor region, and the other one of the plurality of third semiconductor regions are located, and the first part is positioned between the second part and the second region.

8. The device according to claim 1, wherein the sixth semiconductor region includes first and second portions adjacent to each other in the second direction, the first portion is longer than the second portion in the third direction, and a length of the first portion in the third direction corresponds to the length of the sixth semiconductor region.

9. The device according to claim 1, further comprising:

a plurality of fifth semiconductor regions including the fifth semiconductor region, wherein:

an other fifth semiconductor region is located on the other one of the plurality of third semiconductor regions and contacts the sixth semiconductor region, and the fifth semiconductor region and the other fifth semiconductor region overlap in the second direction.

10. The device according to claim 1, wherein at least one of the gate electrode and the conductive part is located between the fifth semiconductor region and the sixth semiconductor region in the second direction.

11. A semiconductor device, comprising:

a first electrode;

a second electrode separated from the first electrode;

a first region located on a portion of the first electrode and positioned between the first electrode and the second electrode, the first region including a first semiconductor region of a first conductivity type, a second semiconductor region of a second conductivity type, a portion of the second semiconductor region being located on the first semiconductor region, a plurality of third semiconductor regions located on the portion of the second semiconductor region, the plurality of third semiconductor regions being of the first conductivity type, a gate electrode facing one of the plurality of third semiconductor regions via a gate insulating layer in a second direction perpendicular to a first direction, the first direction being from the first electrode toward the second electrode, a conductive part facing an other one of the plurality of third semiconductor regions via an insulating layer in the second direction, the conductive part being electrically connected with the second electrode, a fourth semiconductor region located on the one of the plurality of third semiconductor regions, the fourth semiconductor region being of the second conductivity type, a fifth semiconductor region located on the one of the plurality of third semiconductor regions, the fifth semiconductor region being of the first conductivity type, a first-conductivity-type impurity concentration of the fifth semiconductor region being greater than a first-conductivity-type impurity concentration of the one of the plurality of third semiconductor regions, and a sixth semiconductor region located on the other one of the plurality of third semiconductor regions, the sixth semiconductor region being of the first conductivity type, a first-conductivity-type impurity concentration of the sixth semiconductor region being greater than a first-conductivity-type impurity concentration of the other one of the plurality of third semiconductor regions, an area of the sixth semiconductor region per unit area being greater than an area of the fifth semiconductor region per unit area at a first plane perpendicular to the first direction; and a second region located on an other portion of the first electrode and positioned between the first electrode and the second electrode, the second region including a seventh semiconductor region of the second conductivity type, the seventh semiconductor region having a higher second-conductivity-type impurity concentration than the second semiconductor region, an other portion of the second semiconductor region located on the seventh semiconductor region, and an eighth semiconductor region located on the other portion of the second semiconductor region, the eighth semiconductor region being of the first conductivity type.

12. The device according to claim 11, wherein the fourth semiconductor region and the fifth semiconductor region are alternately arranged in the third direction.

13. The device according to claim 11, wherein:

the fifth semiconductor regions are provided respectively on the plurality of third semiconductor regions, and a length in the second direction of the fifth semiconductor region positioned on the other one of the plurality of third semiconductor regions is less than a length in the second direction of an other of the fifth semiconductor regions positioned on the one of the plurality of third semiconductor regions.

14. The device according to claim 13, wherein:

a plurality of the fifth semiconductor regions is arranged in the third direction on the other one of the plurality of third semiconductor regions, and the sixth semiconductor region is located around the plurality of fifth semiconductor regions along a first plane perpendicular to the first direction.

15. The device according to claim 11, wherein the first region includes:

a first part in which the gate electrode, the fifth semiconductor region, the fourth semiconductor region, and the one of the plurality of third semiconductor regions are located; and a second part in which the conductive part, the sixth semiconductor region, and the other one of the plurality of third semiconductor regions are located, and the second part is positioned between the first part and the second region.

16. The device according to claim 15, wherein a length in the second direction of the second part is greater than a distance in the first direction between the first electrode and the second electrode.

17. The device according to claim 11, wherein the first region includes:

a first part in which the gate electrode, the fifth semiconductor region, the fourth semiconductor region, and the one of the plurality of third semiconductor regions are located; and a second part in which the conductive part, the sixth semiconductor region, and the other one of the plurality of third semiconductor regions are located, and the first part is positioned between the second part and the second region.

18. The device according to claim 11, wherein the sixth semiconductor region includes first and second portions adjacent to each other in the second direction, the first portion is longer than the second portion in the third direction, and a length of the first portion in the third direction corresponds to the length of the sixth semiconductor region.

19. The device according to claim 11, further comprising:

a plurality of fifth semiconductor regions including the fifth semiconductor region, wherein:

an other fifth semiconductor region is located on the other one of the plurality of third semiconductor regions and contacts the sixth semiconductor region, and the fifth semiconductor region and the other fifth semiconductor region overlap in the second direction.

20. The device according to claim 11, wherein at least one of the gate electrode and the conductive part is located between the fifth semiconductor region and the sixth semiconductor region in the second direction.

* * * * *